US008487862B2

(12) United States Patent
Chiang

(10) Patent No.: US 8,487,862 B2
(45) Date of Patent: Jul. 16, 2013

(54) SHIFT REGISTER AND DRIVING CIRCUIT FOR LIQUID CRYSTAL DISPLAY

(75) Inventor: Chien-Hsueh Chiang, Miao-Li (TW)

(73) Assignee: Chimei Innolux Corporation, Chu-Nan (TW)

( * ) Notice: Subject to any disclaimer, the term of this patent is extended or adjusted under 35 U.S.C. 154(b) by 401 days.

(21) Appl. No.: 12/965,913

(22) Filed: Dec. 12, 2010

(65) Prior Publication Data
US 2011/0141075 A1 Jun. 16, 2011

(51) Int. Cl.
*G09G 3/36* (2006.01)

(52) U.S. Cl.
USPC .............................. 345/100; 377/64

(58) Field of Classification Search
USPC .................. 345/98–100, 204; 377/64, 70–76
See application file for complete search history.

(56) References Cited

U.S. PATENT DOCUMENTS

| 7,436,923 B2* | 10/2008 | Tobita ............................. 377/64 |
| 8,373,637 B2* | 2/2013 | Ieong et al. ................... 345/100 |
| 2007/0188436 A1* | 8/2007 | Wei et al. ...................... 345/100 |
| 2007/0236270 A1 | 10/2007 | Chiang et al. |

FOREIGN PATENT DOCUMENTS
CN 101056097 A 10/2007

* cited by examiner

*Primary Examiner* — Regina Liang
(74) *Attorney, Agent, or Firm* — WPAT, PC; Justin King

(57) ABSTRACT

A shift register includes first and second shift register units. Two adjacent first shift register units respectively receive a first and second clock signal. Two adjacent second shift register units respectively receive a third and a fourth clock signal. Each first and second shift register unit includes a cascade data input terminal, a cascade data output terminal, an output terminal used to output a shift signal, a feedback terminal, and a reset terminal. The shift signals of the Mth second and Nth first shift register unit are respectively fed back to the feedback terminal of the (N+1)th first and Mth second shift register unit. The reset terminal and the cascade data output terminal of the Nth first and Mth second shift register unit are respectively connected to the output terminal and the cascade data input terminal of (N+1)th first and (M+1)th second shift register unit.

21 Claims, 4 Drawing Sheets

SHIFT REGISTER AND DRIVING CIRCUIT FOR LIQUID CRYSTAL DISPLAY

BACKGROUND

1. Technical Field

The disclosure generally relates to shift registers, and more particularly to a shift register in a driving circuit for a liquid crystal display (LCD).

2. Description of Related Art

An LCD panel usually needs a scanning driving circuit and a data driving circuit to provide scanning signals and display data signals, respectively. A shift register is a core circuit unit of the data driving circuit and scanning driving circuit. Commonly, the shift register includes a plurality of shift register units connected one by one. The stability of signals output from each shift register unit determines the stability of the scanning signals and display data signals output from the scanning driving circuit and the data driving circuit.

Because a loop circuit may be formed between the output of each shift register unit and a feedback circuit thereof, a voltage used to turn on an output transistor may leak from the feedback circuit when a large load is applied to the shift register unit. The output transistor cannot normally be turned on as a result, which leads to an unstable output of the shift register unit.

Therefore, there is room for improvement within the art.

SUMMARY

A shift register includes a plurality of first and second shift register units. Two adjacent first shift register units respectively receive a first and a second clock signal. Two adjacent second shift register units respectively receive a third and a fourth clock signal. Each first and second shift register unit includes a cascade data input terminal, a cascade data output terminal, an output terminal used to output a shift signal, a feedback terminal, and a reset terminal. The shift signals of the Mth second and Nth first shift register unit are respectively fed back to the feedback terminal of the (N+1)th first and Mth second shift register units. The reset terminal and the cascade data output terminal of the Nth first and Mth second shift register units are respectively connected to the output terminal and the cascade data input terminal of (N+1)th first and (M+1)th second shift register units.

A driving circuit incorporating the shift register is also provided.

BRIEF DESCRIPTION OF THE DRAWINGS

Many aspects of the shift register and driving circuit for an LCD can be better understood with reference to the following drawings. The components in the drawings are not necessarily drawn to scale, the emphasis instead being placed upon clearly illustrating the principles of the shift register and driving circuit for an LCD.

DETAILED DESCRIPTION

Figure 1:
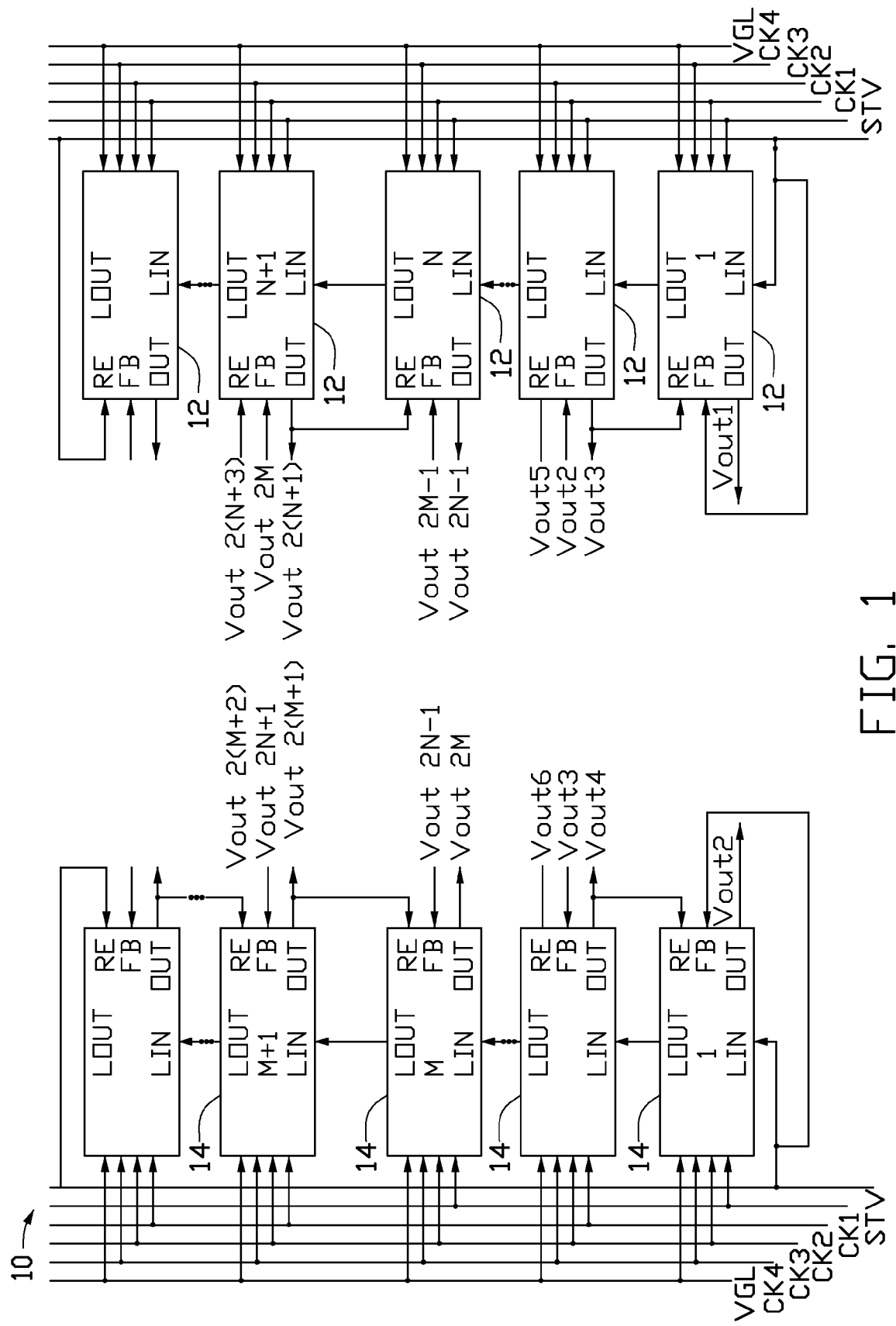
FIG. 1 is an abbreviated block diagram of a shift register according to an exemplary embodiment, the shift register including a plurality of first shift register units and a plurality of second shift register units.

Referring to FIG. 1, an exemplary shift register 10 includes a plurality of first shift register units 12 and a plurality of second shift register units 14. The first shift register units 12 sequentially output a plurality of first shift signals Vout1, Vout3, Vout5 . . . . Vout(2N−1), Vout(2N+1), Vout(2N+3) . . . , wherein N is a natural number. The second shift register units 14 sequentially output a plurality of second shift signals Vout2, Vout4, Vout6 . . . . Vout2M, Vout2(M+1), Vout2 (M+2) . . . , wherein M is a natural number equal to N. The first shift signal Vout(2N+1) outputted from the (N+1)th first shift register unit 12 is different from the first shift signal Vout(2N−1) outputted from the Nth first shift register unit 12 by a pulse width. See for example Vout3 and Vout1 shown in FIG. 3 (wherein, N=1). The second shift signal Vout2M output from the Mth second shift register unit 14 is different from the first shift signal Vout(2N−1) output from the Nth first shift register unit 12 by half a pulse width. See for example Vout2 and Vout1 shown in FIG. 3 (wherein, M=N=1).

The first shift register units 12 and the second shift register units 14 have a similar structure, each of which includes a cascade data input terminal LIN, a cascade data output terminal LOUT, a feedback terminal FB, a reset terminal RE, and an output terminal OUT. Two adjacent first shift register units 12 receive different clock signals, and two adjacent second shift register units 14 receive different clock signals. For example, in this exemplary embodiment, the Nth and (N+1)th first shift register units 12 receive different clock signals, and the Mth and (M+1)th second shift register units 14 receive different clock signals.

The Nth first shift register unit 12 receives a first clock signal CK1 capable of driving and controlling the Nth first shift register unit 12. The cascade data input terminal LIN of the Nth first shift register unit 12 is connected to the cascade data output terminal LOUT of the (N−1)th first shift register unit 12. The cascade data output terminal LOUT of the Nth first shift register unit 12 is connected to the cascade data input terminal LIN of the (N+1)th first shift register unit 12. The feedback terminal FB of the Nth first shift register unit 12 receives the second shift signal Vout2(M−1) of the output terminal OUT of the (M−1)th second shift register unit 14. The reset terminal RE of the Nth first shift register unit 12 receives the first shift signal Vout(2N+1) of the output terminal OUT of the (N+1)th first shift register unit 12.

The (N+1)th first shift register unit 12 receives a second clock signal CK2 capable of driving and controlling the (N+1)th first shift register unit 12. The second clock signal CK2 is a periodic pulse signal inverse to the first clock signal CK1. Furthermore, the (N+1)th first shift register unit 12 receives a third clock signal CK3 and the first clock signal CK1. The Nth first shift register unit 12 receives a fourth clock signal CK4 and the second clock signal CK2. The first and second clock signals CK1 and CK2 are respectively used to control the (N+1)th and Nth first shift register units 12, thereby resetting the (N+1)th and Nth first shift register units 12 quickly. The third and fourth clock signals CK3 and CK4 respectively serve as feedback control signals for the (N+1)th and Nth first shift register units 12. In addition, the cascade data input terminal LIN of the beginning first shift register unit 12 and the cascade data output terminal LOUT of the last first shift register unit 12 receive a starting signal STV from an external circuit (not shown). In the embodiment, the starting signal STV is an initial voltage signal.

The Mth second shift register unit 14 receives a third clock signal CK3 capable of driving and controlling the Mth second shift register unit 14. The cascade data input terminal LIN of the Mth second shift register unit 14 is connected to the cascade data output terminal LOUT of the (M−1)th second shift register unit 14. The cascade data output terminal LOUT of the Mth second shift register unit 14 is connected to the cascade data input terminal LIN of the (M+1)th second shift register unit 14. The feedback terminal FB of the Mth second shift register unit 14 receives the first shift signal Vout(2N−1) from the output terminal OUT of the Nth first shift register unit 12. The reset terminal RE of the Mth second shift register unit 14 receives the second shift signal Vout2(M+1) output from the output terminal OUT of the (M+1)th second shift register unit 14.

The (M+1)th second shift register unit 14 receives the fourth clock signal CK4 capable of driving and controlling the (M+1)th second shift register unit 14. Furthermore, the (M+1)th second shift register unit 14 receives the third clock signal CK3 and the second clock signal CK2. The Mth second shift register unit 14 receives the fourth clock signal CK4 and the first clock signal CK1. The third and fourth clock signals CK3 and CK4 are respectively used to control the (M+1)th and Mth second shift register units 14, thereby resetting the (M+1)th and Mth second shift register units 14 quickly. The first and second clock signals CK1 and CK1 respectively serve as feedback signals for the (M+1)th and Mth second shift register units 14. In addition, the cascade data input terminal LIN of the beginning second shift register unit 14 and the cascade data output terminal LOUT of the last second shift register unit 14 also receive the starting signal STV.

When the cascade data input terminal LIN of the Nth first shift register unit 12 receives a high level voltage signal, such as in the case where the starting signal STV received by the beginning first shift register unit 12 is at a high level, or when the cascade data output terminal LOUT of the (N−1)th first shift register unit 12 outputs a high level voltage signal to the cascade data input terminal LIN of the Nth first shift register unit 12, then the output terminal OUT of the Nth first shift register unit 12 outputs the first shift signal Vout(2N−1), and the output terminal OUT of the (N+1)th first shift register unit 12 outputs the first shift signal Vout(2N+1). The first shift signal Vout(2N+1) is different from the first shift signal Vout(2N−1) by a pulse width. See for example Vout 3 and Vout1 shown in the FIG. 3 (wherein, N=1). When the reset terminal RE of the Nth first shift register unit 12 receives the first signal Vout(2N+1) output from the (N+1)th first shift register unit 12, the Nth first shift register unit 12 outputs a low level voltage signal which resets the output of the Nth first shift register unit 12.

When the cascade data input terminal LIN of the Mth second shift register unit 14 receives a high level voltage signal, such as in the case where the starting signal STV received by the beginning second shift register unit 14 is at a high level, or when the cascade data output terminal LOUT of the (M−1)th second shift register unit 14 outputs a high level voltage signal to the cascade data input terminal LIN of the Mth second shift register unit 14, then the output terminal OUT of the Mth second shift register unit 14 outputs the second shift signal Vout2M, and the output terminal OUT of the (M+1)th second shift register unit 14 outputs the second shift signal Vout2(M+1). The second shift signal Vout2(M+1) is different from the second shift signal Vout2M by a pulse width. When the reset terminal RE of the Mth second shift register unit 14 receives the second shift signal Vout2(M+1) output from the (M+1)th second shift register unit 14, the Mth second shift register unit 14 outputs a low level voltage signal which resets the output of the Mth second shift register unit 14.

Figure 2:
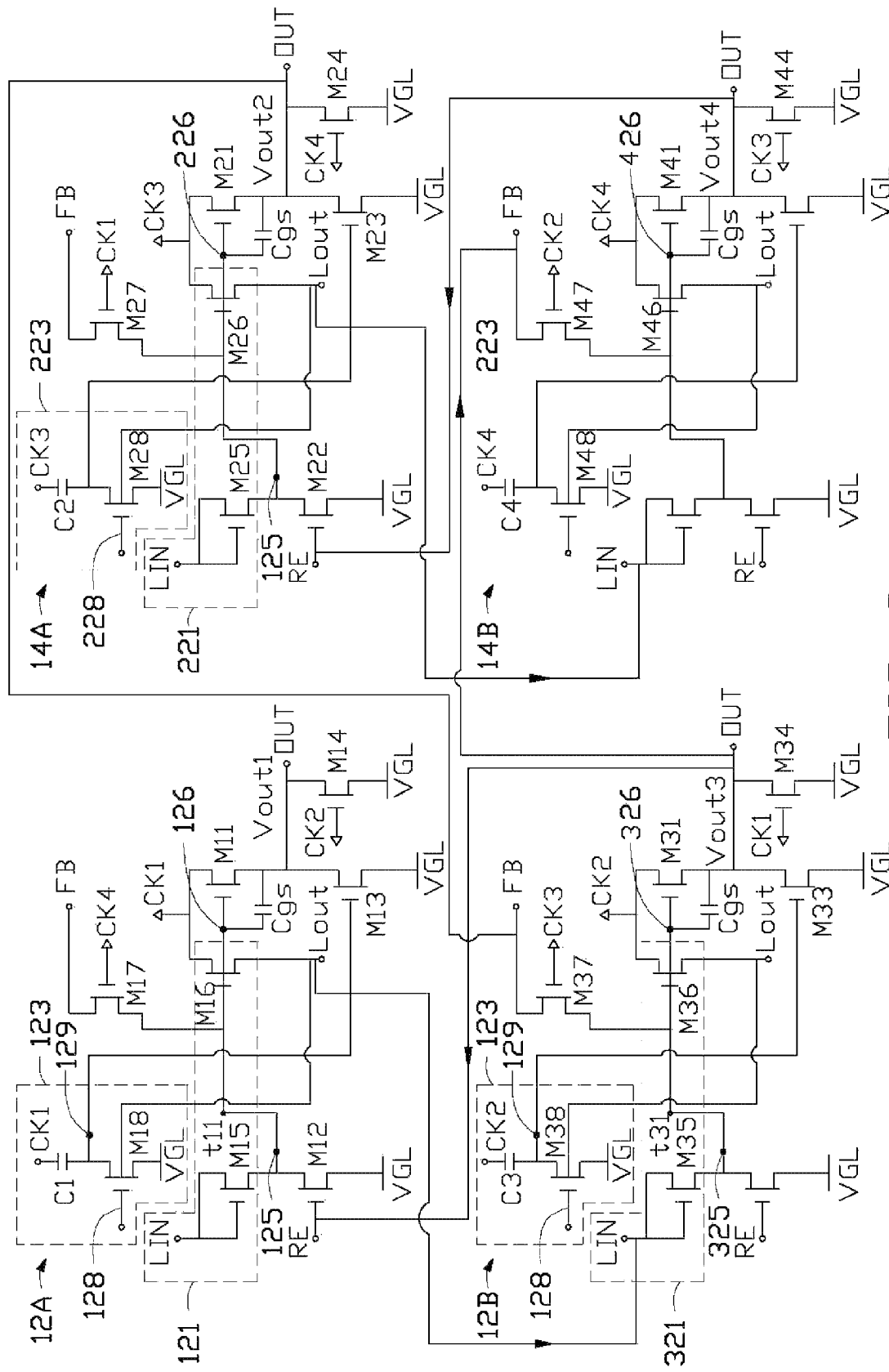
FIG. 2 is a circuit diagram of two first shift register units and two second shift register units of the shift register of FIG. 1.

Referring to FIG. 2, in an exemplary embodiment, N=M=2. Two first shift register units 12A and 12B and two second shift register units 14A and 14B of the first and second shift register units 12, 14 are illustrated.

The first shift register unit 12A includes an output transistor M11, a logic output control module 121, a feedback switch M17, a reset transistor M12, two pull down transistors M13 and M14, and a pull down signal control module 123.

The logic output control module 121 includes a plurality of transistors, here, a first transistor M15 and a cascade control transistor M16. A source of the first transistor M15 is the cascade data input terminal LIN of the first shift register unit 12A, and receives the starting signal STV. A gate of the first transistor M15 is connected to the source thereof. A drain of the first transistor M15 serves as the output terminal 125 of the logic output control module 121. A gate of the cascade control transistor M16 is connected to the drain of the first transistor M15. A source of the cascade control transistor M16 is connected to a source of the output transistor M11. A drain of the cascade control transistor M16 serves as the cascade data output terminal LOUT of the first shift register unit 12A.

The output transistor M11 includes a source, a drain, and a control terminal 126 controlling on/off states of the output transistor M11. The control terminal 126 is connected to the output terminal 125 of the logic output control module 121. The source of the output transistor M11 receives the first clock signal CK1 used to drive the first shift register unit 12A. The drain of the output terminal 125 serves as the output terminal OUT of the first shift register unit 12A. The logic output control module 121 outputs signals used to turn on/off the output transistor M11. When the output transistor M11 is turned on, a signal synchronous to the first clock signal CK1 is output from the output terminal OUT via the output transistor M11, and serves as the initial first shift signal Vout1. The output transistor M11 further includes a parasitic capacitor Cgs, which is connected to the control terminal 126 and the drain of the output transistor M11.

The feedback switch M17 may be a three terminal transistor. A gate of the feedback switch M17 receives the fourth clock signal CK4. A source of the feedback switch M17 serves as the feedback terminal FB of the first shift register unit 12A, and receives the starting signal STV. A drain of the feedback switch M17 is connected the control terminal 126 of the output transistor M11.

A gate of the reset transistor M12 serves as the reset terminal RE of the first shift register unit 12A. A source of the reset transistor M12 is connected to the output terminal 125 of the logic output control module 121. A drain of the reset transistor M12 receives a low level cut-off voltage VGL.

The two pull down transistors M13 and M14 are connected between the drain of the output transistor M11 and the low level cut-off voltage VGL. The pull down signal control module 123 controls on/off states of the pull down transistor M13. The second clock signal CK2 controls on/off states of the pull down transistor M14. When the two pull down transistors M13 and M14 are turned on, the first shift signal Vout1 output from the first shift register unit 12A is pulled down from a high level to a low level. That is, the first shift register unit 12A stops outputting the first shift signal Vout1.

The pull down signal control module 123 includes a control input terminal 128, a control output terminal 129, a second transistor M18, and a capacitor C1. A gate of the second transistor M18 serves as the control input terminal 128, and is connected to the drain of the cascade control transistor M16. The second transistor M18 controls on/off states of the pull down transistor M13 using the control output terminal 129 according to signals output from the drain of the cascade control transistor M16. A source of the second transistor M18 receives the first clock signal CK1 via the capacitor C1. The source of the second transistor M18 serves as the control output terminal 129. The drain of the second transistor M18 is connected to the cut-off voltage VGL.

The second shift register unit 14A, the first shift register unit 12B, and the second shift register unit 14B are substantially similar to the first shift register unit 12A in structure. Differences among these shift register units 12A, 12B, 14A, 14B are as follows:

In the second shift register unit 14A, a source of the output transistor 21 and a source of the cascade control transistor M26 receive the third clock signal CK3. A gate of the feedback switch M27 receives the first clock signal CK1. A source of the second transistor M28 receives the third clock signal CK3 via the capacitor C2. A gate of the pull down transistor M24 receives the fourth clock signal CK4. The second shift register unit 14A outputs the second shift signal Vout2, which is different from the first shift signal Vout1 by half a pulse width.

In the first shift register unit 12B, a source of the output transistor M31 and a source of the cascade control transistor M36 receive the second clock signal CK2. A gate of the feedback switch M37 receives the third clock signal CK3. A source of the second transistor M38 receives the second clock signal CK2 via the capacitor C3. A gate of the pull down transistor M34 receives the first clock signal CK1. The first shift register unit 12B outputs the first shift signal Vout3, which is different from the first shift signal Vout1 by a pulse width.

In the second shift register unit 14B, a source of the output transistor M41 and a source of the cascade control transistor M46 receive the fourth clock signal CK4. A gate of the feedback switch M47 receives the second clock signal CK2. A source of the second transistor M48 receives the fourth clock signal CK4 via the capacitor C4. A gate of the pull down transistor M44 receives the third clock signal CK3. The second shift register unit 14B outputs the second shift signal Vout4, which is different from the first shift signal Vout1 by one and a half pulse widths.

Connections of the subsequent first shift register units 12 and second shift register units 14 are substantially similar to the four shift register units 12A, 12B, 14A, and 14B. Therefore, they are not described herein.

Figure 3:
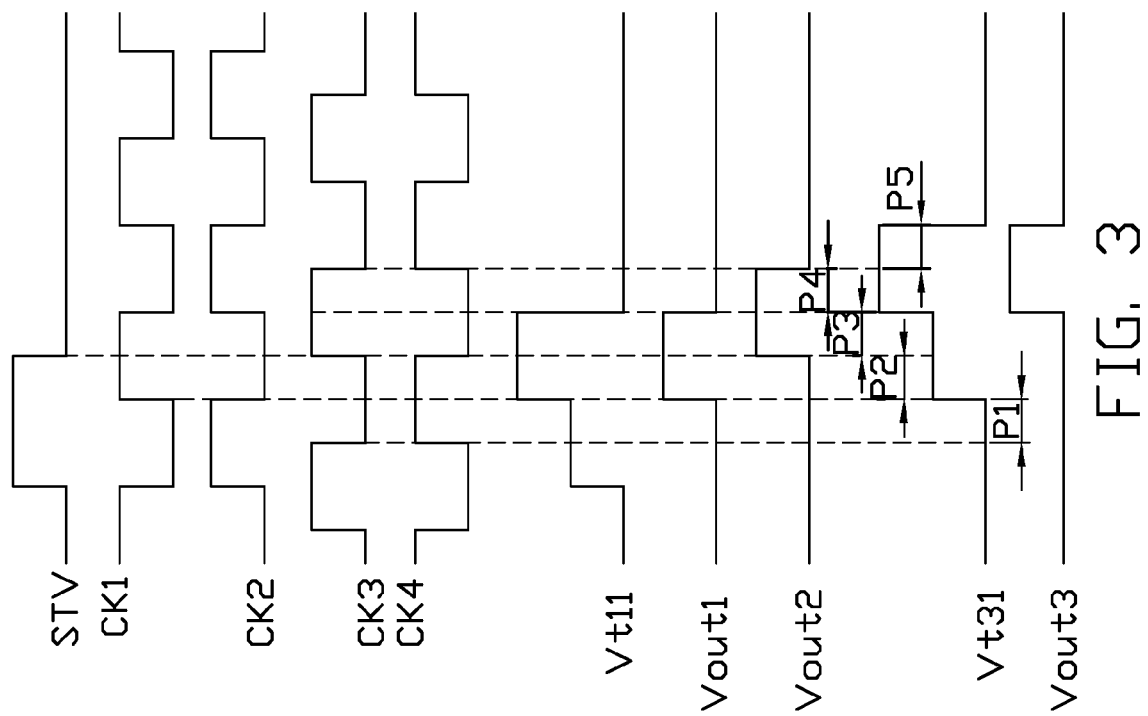
FIG. 3 is a sequence waveform diagram of exemplary pulse signals of the two first shift register units and one of the second shift register units of FIG. 2.

Referring to FIG. 3, Vout1, Vout2 and Vout3 respectively represent waveforms of the shift signals output from the first shift register unit 12A, the second shift register unit 14A, and the first shift register unit 12B. Vt11 represents a waveform of a voltage signal of a node t11, which is between the output terminal 125 of the logic output control module 121 and the control terminal 126 of the output transistor M11 of the first shift register unit 12A. Vt31 represents a waveform of a voltage signal of a node t31, which is between the output terminal 325 of the logic output control module 321 and the control terminal 326 of the output transistor M31 of the first shift register unit 12B.

During a first period P1, the starting signal STV is at a high level. The first to fourth clock signals CK1 to CK4 are respectively at a low level, a high level, a low level, and a high level.

In the first shift register unit 12A, the first transistor M15 is turned on. The logic output control module 121 outputs a high level signal. That is, the node t11 outputs a high level signal VGH, thus the output transistor M11 is turned on. The parasitic capacitor Cgs of the output transistor M11 is charged. The cascade control transistor M16 is also turned on. However, the first clock signal CK1 used to drive the first shift register unit 12A is at a low level, thus the output terminal OUT and the cascade data output terminal LOUT are maintained at a low level.

In the second shift register unit 14A, the first transistor M25 is turned on. The output transistor M21 is turned on. The parasitic capacitor Cgs is charged. The cascade control transistor M26 is also turned on. However, the third clock signal CK3 used to drive the second shift register unit 14A is at a low level, thus the output terminal OUT and the cascade data output terminal LOUT are maintained at a low level.

Because the cascade data output terminals LOUT of the first and second shift registers units 12A and 14A are at a low level, outputs of the subsequent first and second shift register units 12B and 14B also remain at a low level.

During a second period P2, the first clock signal CK1 turns from a low level to a high level. The second clock signal CK2 turns from a low level to a high level. The third clock signal CK3 remains at a low level during the second period P2. The fourth clock signal CK4 remains at a high level during the second period P2.

In the first shift register unit 12A, the node voltage Vt11 is raised to 2VGH due to an effect of the charged parasitic capacitor Cgs. The output transistor M11 and the cascade control transistor M16 are turned on. The output terminal OUT outputs the high level first shift signal Vout1. The output voltage of the first shift signal Vout1 is VGH. The cascade data output terminal LOUT also outputs a high level voltage signal. The pull down signal control module 123 controls an on state of the second transistor M18 due to receiving the high level voltage signal output from the cascade data output terminal LOUT by the control input terminal 128. Thus, the first clock signal CK1 charges the capacitor C1. The control output terminal 129 of the pull down signal control module 123 outputs a low level voltage signal to cause the pull down transistor M13 to be turned off. Meanwhile, the second clock signal CK2 is also at a low level, and the pull down transistor M14 is also turned off. Thus, the pull down transistors M13 and M14 are unable to influence the first shift signal Vout1. Further, because a voltage of the drain of the feedback switch M17 is 2VGH, the feedback switch M17 is turned off, and the feedback switch M17 is unable to influence the node voltage Vt11 nor the first shift signal Vout1.

In addition, the third clock signal CK3 used to drive the second shift register unit 14A remains at a low level, and thus the output of the second shift register unit 14A is maintained at a low level.

In the first shift register unit 12B, the cascade data input terminal LIN receives the high level voltage signal output from the cascade data output terminal LOUT of the first shift register unit 12A, and thus the first transistor M35 is turned on. The logic output control module 321 outputs a high level voltage signal which controls an on state of the output transistor M31 and the cascade control transistor M36. However, the second clock signal CK2 used to drive the first shift register unit 12B is at a low level, thus the output of the output terminal OUT is maintained at a low level. The reset transistor M12 of the first shift register unit 12A is turned off, and thus the reset transistor M12 is unable to influence the node voltage Vt11 nor the first shift signal Vout1.

During the third period P3, the third clock signal CK3 turns from a low level to a high level. The fourth clock signal CK4 turns from a high level to a low level. The first clock signal CK1 remains at a high level. The second clock signal CK2 remains at a low level.

In the first shift register unit 12A, the starting signal STV is at the low level. That is, the gate and source of the first transistor M15 are at the low level. Thus the first transistor M15 is unable to influence the logic output control module 121, and the first shift register unit 12A maintains output of the first shift signal Vout1.

Meanwhile, in the second shift register unit 14A, the first transistor M25 is unable to influence the logic output control module 221. The third clock signal CK3 is at a high level, and thus the output terminal OUT outputs a high level second shift signal Vout2. The second shift signal Vout2 is different from the first shift signal Vout1 by a pulse width.

In the first shift register unit 12B, the cascade data input terminal LIN receives the high level voltage signal output from the cascade data output terminal LOUT of the first shift register unit 12A. The first transistor M35 stays turned on. The logic output control module 321 outputs a high level voltage signal to the output transistor M31 and the cascade control transistor M36. That is, the node t31 outputs a high level voltage signal. The node voltage Vt31 of the node t31 maintains output of the voltage signal VGH. The output transistor M31 is turned on. The cascade control transistor M36 is also turned on. However, the second clock signal CK2 used to drive the first shift register unit 12B is at a low level. Thus, the output terminal OUT and the cascade data output terminal LOUT of the first shift register unit 12B remain at a low level output, and are unable to influence the first shift signal Vout1 output from the first shift register unit 12A. In addition, although the third clock signal CK3 is at a high level, voltages of the three terminals of the feedback switch M37 are at a high level. Thus, the feedback switch M37 is turned off, and is unable to influence the node voltage Vt31.

During the period P4, the first clock signal CK1 turns from a high level to a low level. The second clock signal CK2 turns from a low level to a high level. The third clock signal CK3 maintains a high level. The fourth clock signal CK4 remains at a low level.

In the first shift register unit 12A, the starting signal STV is at a low level; that is, the gate and source of the first transistor M15 are at a low level. The first transistor M15 is unable to influence the logic output control module 121 of the first shift register unit 12A. The output transistor M11 and the cascade control transistor M16 are still turned on. However, the first clock signal CK1 used to drive the first shift register unit 12A is at a low level. Thus the outputs of the output terminal OUT and the cascade data output terminal LOUT of the first shift register unit 12A go from a high level to a low level. In addition, because the control input terminal 128 of the pull down signal control module 123 receives a low level output from the cascade data output terminal LOUT, the second transistor M18 is turned off, the capacitor C1 is discharged to turn on the pull down transistor M13, and the first shift signal Vout1 output from the output terminal OUT quickly jumps to a low level.

Meanwhile, in the first shift register unit 12B, the cascade data input terminal LIN receives the low level voltage signal output from the cascade data output terminal LOUT of the first shift register unit 12A. That is, the gate and source of the first transistor M35 are at a low level. The first transistor M35 is unable to influence the output of the logic output control circuit 321 nor the node voltage Vt31. The node voltage Vt31 is raised to 2VGH due to the parasitic capacitor Cgs, and thus the output transistor M31 and the cascade control transistor M36 stay turned on. Because the clock signal CK2 used to drive the first shift register unit 12B jumps to a high level, the first shift register unit 12B outputs a high level first shift signal Vout3.

The reset terminal RE of the first shift register unit 12A continually receives the high level first shift signal Vout3. The reset transistor M12 is turned on. The node voltage Vt11 is pulled down to a low level. Thus, the output transistor M11 and the cascade control transistor M16 of the first shift register unit 12A are turned off. The first shift register unit 12A maintains a low level output.

In the second shift register unit 14A, because the third clock signal CK3 used to drive the second shift register unit 14A remains at a high level, the fourth clock signal CK4 used to control the pull down transistor M24 stays at a low level, and the reset transistor M22 and the pull down transistor M23 are turned off. The output terminal OUT of the second shift register unit 14A cannot be affected and outputs a high level second shift signal Vout2, which is different from the first shift signal Vout1 by half a pulse width.

When the feedback terminal FB of the first shift register unit 12B receives the second shift signal Vout2, although the third clock signal CK3 is at a high level, the feedback switch M37 is turned off due to the node voltage Vt31 being 2VGH, and the feedback switch M37 is unable to influence the first shift signal Vout3.

During the period P5, the third clock signal CK3 goes from a high level to a low level. The fourth clock signal CK4 goes from a low level to a high level. The first clock signal CK1 remains at a low level. The second clock signal CK2 remains at a high level.

In the second shift register unit 14A, the starting signal STV is at a low level, thus the gate and the source of the first transistor M25 are at a low level. The first transistor M25 is unable to influence the logic output control module 221. The output transistor M21 and the cascade control transistor M26 are still turned on. The third clock signal CK3 used to drive the second shift register unit 14A is at a low level, thus the output of the output terminal OUT and the cascade data output terminal LOUT of the second shift register unit 14A go from a high level to a low level. In addition, the control input terminal of the pull down signal control module 223 receives the low level signal. The second transistor M28 is turned off. The capacitor C2 is discharged to turn on the pull down transistor M23. The second shift signal Vout2 can quickly jump to a low level.

Meanwhile, in the first shift register unit 12B, the node voltage Vt31 stays at 2VGH. The output transistor M31 and the cascade control transistor 36 remain turned on. Because the second clock signal CK2 stays at a high level, the first shift register unit 12B maintains the output of the first shift signal Vout3 at a high level.

Connections of the subsequent first shift register units 12 and second shift register units 14 are substantially similar to the four shift register units 12A, 12B, 14A, and 14B. An operation principle of the subsequent first shift register units 12 and second shift register units 14 is also substantially similar to the four shift register units 12A, 12B, 14A, and 14B, and therefore is not described herein.

With the operation principle described above, because the second shift signal Vout2M of the Mth second shift register unit 14 is fed back to the feedback terminal FB of the (N+1)th first shift register unit 12, and because the first shift signal Vout(2N−1) of the Nth first shift register unit 12 is fed back to the feedback terminal of the Mth second shift register unit 14, even if a large load is applied to the Nth first shift register unit 12 and the Mth second shift register unit 14, the feedback switches such as M17 and M37 are unable to influence the output transistors such as M11 and M31, and accordingly the corresponding shift register units 12, 14 can have stable outputs.

Figure 4:
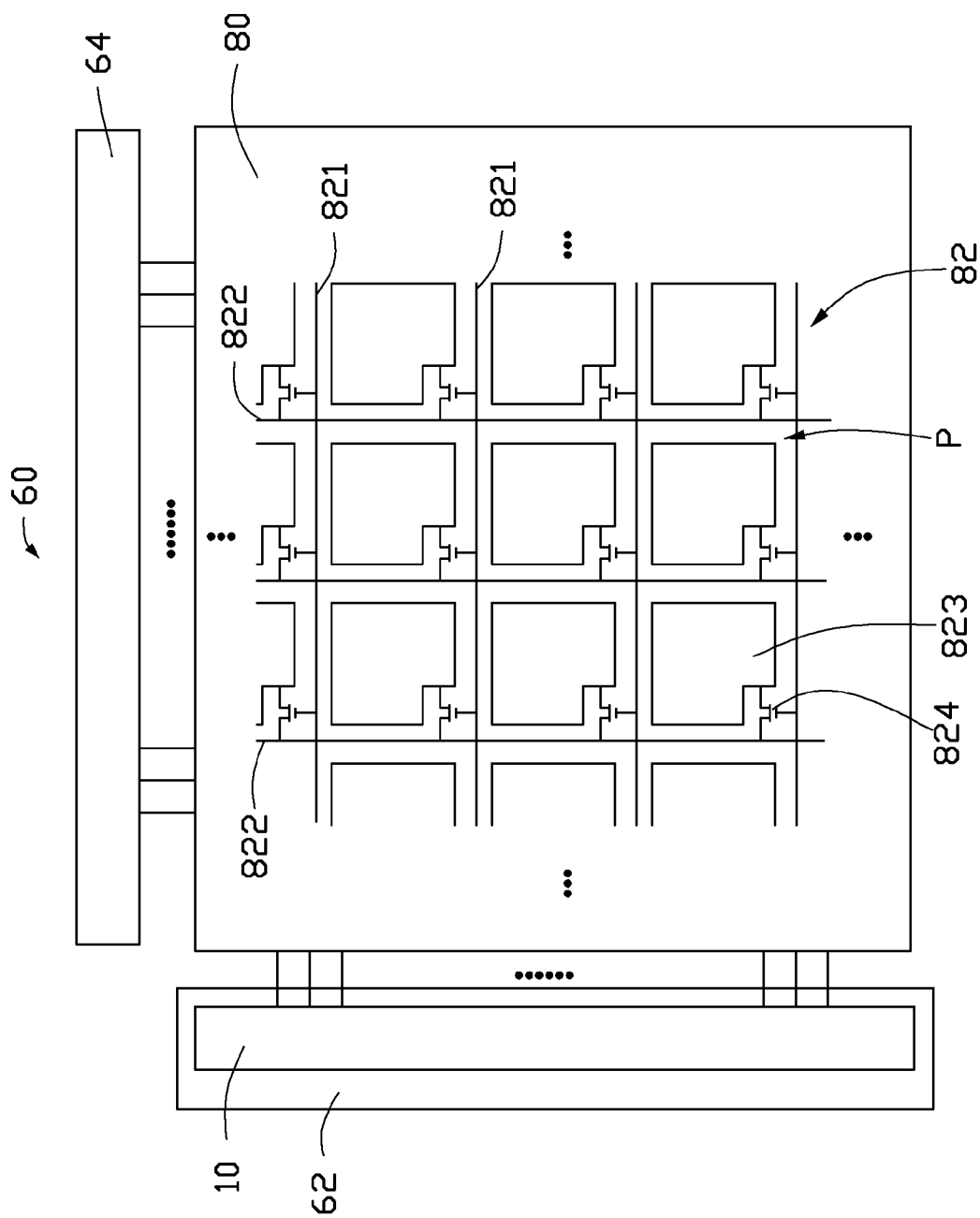
FIG. 4 is an abbreviated block diagram of a driving circuit of an LCD, according to an exemplary embodiment.

Referring to FIG. 4, a driving circuit 60 used to provide scanning signals and data display signals for an LCD panel 80 includes a driving array 82. The driving array 82 includes a plurality of parallel and spaced scanning lines 821, and a plurality of parallel and spaced data lines 822 perpendicular to the scanning lines 821. The driving array 82 defines a plurality of pixel regions P, each of which is formed by two adjacent scanning lines 821 and two adjacent data lines 822. Each pixel region P includes a pixel electrode 823 and a switch 824. A scanning signal transmitted by the corresponding scanning line 821 controls the switch 824 to turn on/off. When the switch 824 is turned on, the corresponding display data signal is transmitted to the pixel electrode 823 via the corresponding data line 821 and the switch 824.

The driving circuit 60 includes a scanning driving circuit 62 used to provide the scanning signals, and a data driving circuit 64 used to provide the display data signals. The scanning driving circuit 62 includes the shift register 10. The shift register 10 outputs the first and second shift signals Vout1, Vout2, Vout3, and Vout4 . . . as the scanning signals of the scanning lines 821. The first shift register units 12 sequentially provide the scanning signals for odd-numbered scanning lines 821 in the driving array 82, and the second shift register units 14 sequentially provide the scanning signals for even-numbered scanning lines 821 in the driving array 82. In other exemplary embodiments, the driving circuit 60 may use only the first shift register units 12 or only the second shift register units 14 for the scanning lines 821, to provide the first shift signals Vout1, Vout3, and Vout5 . . . or the second shift signals Vout2, Vout4, and Vout6 . . . , respectively.

The stability of the scanning signals output from the scanning driving circuit 62 can be effectively raised by using the shift register 10 to provide the scanning signals.

It is believed that the exemplary embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments.

What is claimed is:

1. A shift register comprising:
a plurality of first shift register units outputting a plurality of first shift signals, two adjacent first shift register units respectively receiving a first clock signal and a second clock signal, the second clock signal being inverse to the first clock signal; and
a plurality of second shift register units outputting a plurality of second shift signals, two adjacent second shift register units respectively receiving a third clock signal and a fourth clock signal, the third clock signal being inverse to the fourth clock signal and being different from the first clock signal by half a period;
wherein each of the first shift register units and each of the second shift register units includes a cascade data input terminal, a cascade data output terminal, a first output terminal used to output a corresponding first or second shift signal, a feedback terminal, and a reset terminal;
the second shift signal of an Mth second shift register unit is fed back to the feedback terminal of an (N+1)th first shift register unit, the first shift signal of an Nth first shift register unit is fed back to the feedback terminal of the Mth second shift register unit, M is a natural number equal to N, and the reset terminal and the cascade data output terminal of the Nth first shift register unit are connected to the first output terminal and the cascade data input terminal of the (N+1)th first shift register unit, respectively;
the reset terminal and the cascade data output terminal of the Mth second shift register unit are connected to the first output terminal and the cascade data input terminal of an (M+1)th first shift register unit, respectively;
when the cascade data input terminal of the Nth first shift register unit receives an initial voltage signal, the Nth first shift register unit outputs one of the first shift signals synchronous to the first clock signal, and the (N+1)th first shift register unit outputs another one of the first shift signals synchronous to the second clock signal; and meanwhile, the reset terminal of the Nth first shift register unit determines whether to reset the Nth first shift register unit according to the other one of the first shift signals output from the (N+1)th first shift register unit; and
when the cascade data input terminal of the Mth second shift register unit receives the initial voltage signal, the Mth second shift register unit outputs one of the second shift signals synchronous to the third clock signal, and the (M+1)th second shift register unit outputs another one of the second shift signals synchronous to the fourth clock signal; and meanwhile, the reset terminal of the Mth second shift register unit determines whether to reset the Mth second shift register unit according to the other one of the second shift signals output from the (M+1)th second shift register unit.

2. The shift register as claimed in claim 1, wherein each first shift register unit and each second shift register unit further includes an output transistor, a control terminal of the output transistor controlling on/off states of the output transistor; when the output transistor of the Nth first register unit is turned on, the first clock signal or the second clock signal is output from the first output terminal of the corresponding first shift register unit; and when the output transistor of the Mth second shift register unit or the (M+1)th second shift register unit is turned on, the third clock signal or the fourth clock signal is output from the first output terminal of the corresponding second shift register unit.

3. The shift register as claimed in claim 2, wherein each first shift register unit and each second shift register unit further includes a logic output control module, and a second output terminal of the logic output control module is connected to the control terminal of the corresponding output transistor, and controls whether to provide the initial voltage signal to the control terminal of the output transistor.

4. The shift register as claimed in claim 3, wherein the logic output control module includes a first transistor, a source of the first transistor serves as the cascade data input terminal of the corresponding shift register unit, a gate of the first transistor is connected to the source, and a drain of the first transistor serves as the second output terminal of the logic output control module.

5. The shift register as claimed in claim 3, wherein each first shift register unit and each second shift register unit further includes a feedback switch, and the feedback switch is connected between the control terminal of the output transistor and the corresponding feedback terminal.

6. The shift register as claimed in claim 5, wherein the feedback switch comprises a three-terminal transistor.

7. The shift register as claimed in claim 6, wherein when the Nth first shift register unit receives the first clock signal, a gate of the feedback switch of the Nth first shift register unit receives the fourth clock signal, and a gate of the feedback switch of the (N+1)th first shift register unit receives the third clock signal.

8. The shift register as claimed in claim 6, wherein when the Mth second shift register unit receives the third clock signal, a gate of the feedback switch of the Mth second shift register unit receives the first clock signal, and a gate of the feedback switch of the (M+1)th second shift register unit receives the second clock signal.

9. The shift register as claimed in claim 5, wherein each first shift register unit and each second shift register unit further includes a reset transistor, a gate of the reset transistor serves as the reset terminal, a source of the reset transistor is connected to the corresponding control terminal of the output transistor, and a drain of the reset transistor receives a cut-off voltage.

10. The shift register as claimed in claim 9, wherein when the (N+1)th first shift register unit outputs a high level first shift signal which turns on the reset transistor of the Nth first register unit, the reset transistor outputs the cut-off voltage to pull the initial voltage signal output from the corresponding logic output control module down to the cut-off voltage, so as to turn off the output transistor of the Nth first shift register unit.

11. The shift register as claimed in claim 9, wherein when the (M+1)th second shift register unit outputs a high level second shift signal which turns on the reset transistor of the Mth second register unit, the reset transistor outputs the cut-off voltage to pull the initial voltage signal output from the corresponding logic output control module down to the cut-off voltage, so as to turn off the output transistor of the Mth second shift register unit.

12. The shift register as claimed in claim 4, wherein the logic output control module further includes a cascade control transistor, a gate of the cascade control transistor is connected to the drain of the first transistor, a source of the cascade control transistor is connected to a source of the corresponding output transistor, and a drain of the cascade control transistor serves as the corresponding cascade data output terminal.

13. The shift register as claimed in claim 12, wherein each first shift register unit and each second shift register unit further includes at least one pull down transistor, and the at least one pull down transistor is connected between a cut-off voltage and a drain of the corresponding output transistor.

14. The shift register as claimed in claim 13, wherein each first shift register unit and each second shift register unit further includes a pull down signal control module, each pull down signal control module includes a control input terminal and a control output terminal, the pull down signal control module of the first shift register unit receives the corresponding first or second clock signal, and the pull down signal control module of the second shift register unit receives the corresponding third or fourth clock signal; the control input terminal is connected to the drain of the corresponding cascade control transistor, and controls on/off states of the at least one pull down transistor via the control output terminal according to signals output from the drain of the corresponding cascade control transistor; and when the at least one pull down transistor is turned on, the shift signals output from the corresponding first and second shift register units are pulled down.

15. The shift register as claimed in claim 14, wherein the pull down signal control module includes a second transistor, a gate of the second transistor serves as the control input terminal of the pull down signal control module, a source of the second transistor receives the corresponding clock signal via a capacitor, and a drain of the second transistor is connected to the cut-off voltage.

16. The shift register as claimed in claim 13, wherein when the Nth first shift register unit further receives the second clock signal, the second clock signal controls on/off states of the corresponding at least one pull down transistor; and when the (N+1)th first shift register unit further receives the first clock signal, the first clock signal controls on/off states of the corresponding at least one pull down transistor.

17. The shift register as claimed in claim 13, wherein when the Mth first shift register unit further receives the fourth clock signal, the fourth clock signal controls on/off states of the corresponding at least one pull down transistor; and when the (M+1)th first shift register unit further receives the third clock signal, the third clock signal controls on/off states of the corresponding at least one pull down transistor.

18. A driving circuit for a liquid crystal display (LCD), the driving circuit comprising:
a plurality of pixel electrodes;
a plurality of scanning lines;
a plurality of data lines each perpendicular to each of the scanning lines;
a data driving circuit providing display data signals to the pixel electrodes via the data lines; and
a scanning driving circuit comprising the shift register of claim 1, the scanning driving circuit providing scanning signals to the pixel electrodes via the scanning lines, wherein the scanning signals are selected from the group consisting of the first shift signals output from the shift register, the second shift signals output from the shift register, and the first and second shift signals output from the shift register.

19. The driving circuit as claimed in claim 18, wherein the scanning signals are the first and second shift signals output from the shift register, the first shift register units of the shift register provide the scanning signals for odd-numbered scanning lines of the plurality of scanning lines, and the second shift register units of the shift register provide the scanning signals for even-numbered scanning lines of the plurality of scanning lines.

20. The driving circuit as claimed in claim 18, wherein the scanning signals are the first shift signals output from the first shift register units of the shift register.

21. The driving circuit as claimed in claim 18, wherein the scanning signals are the second shift signals output from the second shift register units of the shift register.

* * * * *